United States Patent
Lin et al.

(10) Patent No.: US 10,090,862 B2
(45) Date of Patent: Oct. 2, 2018

(54) HYBRID SOFT DECODING ALGORITHM FOR MULTIPLE-DIMENSION TPC CODES

(71) Applicant: SK Hynix Inc., Gyeonggi-do (KR)

(72) Inventors: Yi-Min Lin, San Jose, CA (US); Aman Bhatia, San Jose, CA (US); Naveen Kumar, San Jose, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/433,857

(22) Filed: Feb. 15, 2017

(65) Prior Publication Data

US 2017/0279466 A1   Sep. 28, 2017

Related U.S. Application Data

(60) Provisional application No. 62/312,324, filed on Mar. 23, 2016.

(51) Int. Cl.
*H03M 13/00* (2006.01)
*H03M 13/29* (2006.01)
(Continued)

(52) U.S. Cl.
CPC ..... *H03M 13/2963* (2013.01); *H03M 13/136* (2013.01); *H03M 13/152* (2013.01);
(Continued)

(58) Field of Classification Search
CPC ........... H03M 13/2963; H03M 13/136; H03M 13/152; H03M 13/2909; H03M 13/6502
See application file for complete search history.

(56) References Cited

U.S. PATENT DOCUMENTS 6,966,024 B2 * 11/2005 Park ............... H03M 13/45
                                                  714/774
7,039,846 B2   5/2006 Hewitt et al.
(Continued)

OTHER PUBLICATIONS

Alexei Ashikhmin et al. "Simple MAP decoding of first-order Reed-Muller and Hamming codes," to A. Ashikhmin, S. Litsyn, published in IEEE Trans. Inform Theory, vol. 50, No. 8, pp. 1812-1818, Aug. 2004, 7 pages.
(Continued)

*Primary Examiner* — Esaw T Abraham
(74) *Attorney, Agent, or Firm* — Kilpatrick Townsend & Stockton LLP

(57) ABSTRACT

An apparatus for decoding a TPC codeword is disclosed. The apparatus includes a memory and a processor coupled to the memory. The processor is configured to receive a first set of soft information corresponding to the TPC codeword. The TPC codeword includes at least one codeword corresponding to each of first, second, and third dimensions. The processor is further configured to iteratively perform a first soft decoding procedure on the at least one codeword corresponding to the first dimension to generate a first candidate codeword and upon determining that the first candidate codeword is not a correct codeword, and perform a second decoding procedure on the at least one codeword corresponding to the third dimension to generate a second candidate codeword. The second decoding procedure generates a second set of soft information to be used at a later iteration of the first decoding procedure.

20 Claims, 7 Drawing Sheets

(51) Int. Cl.
  H03M 13/13 (2006.01)
  H03M 13/15 (2006.01)
(52) U.S. Cl.
  CPC ..... H03M 13/2909 (2013.01); H03M 13/618 (2013.01); H03M 13/6502 (2013.01)

(56) References Cited

U.S. PATENT DOCUMENTS

| | | | |
|---|---|---|---|
| 7,092,457 B1* | 8/2006 | Chugg | H04L 1/005 375/324 |
| 7,260,762 B2* | 8/2007 | Desai | H03M 13/2963 714/755 |
| 7,310,767 B2* | 12/2007 | Desai | H03M 13/2909 714/780 |
| 7,373,585 B2* | 5/2008 | Yedidia | H03M 13/1108 714/786 |
| 7,510,767 B2 | 3/2009 | Hatsuda et al. | |
| 7,515,601 B2* | 4/2009 | Lai | H04L 1/005 370/442 |
| 7,886,752 B2 | 2/2011 | Jerg | |
| 7,986,752 B2* | 7/2011 | Nikopour-Deilami | H04L 1/005 375/341 |
| 8,352,840 B2* | 1/2013 | Crozier | H03M 13/296 714/780 |
| 8,473,780 B2 | 6/2013 | Shalvi | |
| 8,599,959 B2* | 12/2013 | Krachkovsky | H04L 1/0042 375/295 |
| 8,850,296 B2 | 9/2014 | Weingarten et al. | |
| 8,850,298 B2 | 9/2014 | Wu | |
| 8,943,384 B2* | 1/2015 | Sridhara | G06F 11/1048 714/755 |
| 9,135,155 B2* | 9/2015 | Sharon | G06F 11/1012 |
| 9,231,623 B1 | 1/2016 | Kumar et al. | |
| 9,337,873 B2 | 5/2016 | Marrow et al. | |
| 9,454,428 B2* | 9/2016 | Cai | H03M 13/458 |
| 9,645,763 B2* | 5/2017 | Sankaranarayanan | G06F 3/0653 |
| 2003/0093740 A1 | 5/2003 | Stojanovic | |
| 2015/0333776 A1 | 11/2015 | Bolotov et al. | |
| 2016/0164543 A1 | 6/2016 | Kumar | |
| 2017/0279465 A1 | 9/2017 | Kumar et al. | |
| 2017/0279467 A1 | 9/2017 | Bhatia et al. | |

OTHER PUBLICATIONS

Fijo Therattil et al. "A Low-complexity Soft-decision Decoder for Extended BCH and RS-like codes, " published in Conference: Information Theory, 2005. ISIT 2005. Proceedings. International Symposium, Oct. 2005, 5 pages.

Trushita Chaware et al "Performance of Turbo Product Code in Wimax, " published in IJACSA Special Issue on Selected Papers from International Conference & Workshop on Advance Computing, 2013, 5 pages.

Ruiyuan Hu et al "Quantization and Quantization Sensitivity of Soft-Output Product Codes for Fast-Speed Applications," published in Advances in Wired and Wireless Communication, 2004 IEEE/Sarnoff Symposium on Apr. 26-27, 2007, 4 pages.

Non-Final Office Action for U.S. Appl. No. 15/431,554, dated Dec. 27, 2017, 12 pages.

Non-Final Office Action for U.S. Appl. No. 15/432,255, dated Dec. 27, 2017, 11 pages.

Thierry Goubier "Fine Grain Parallel Decoding of Turbo Product Codes: Algorithm and Architecture", Oct. 2008, 6 pages.

Phong S. Nguyen "On Multiple Decoding Attempts for Reed-Solomon Codes: A Rate-Distortion Approach", Nov. 9, 2010, 55 pages.

Gabi Sarkis "Increasing the Speed of Polar List Decoders", Jun. 10, 2014, 6 pages.

Simon A. Hirst "Fast Chase Algorithm With an Application in Turbo Decoding", IEEE Transactions on Communications, vol. 49, No. 10, Oct. 2001, 7 pages.

R. Pyndiah "Near-Optimum Decoding of Product Codes: Block Turbo Codes",IEEE Transactions on Communications, vol. 46, No. 8, Aug. 1998, 8 pages.

* cited by examiner

HYBRID SOFT DECODING ALGORITHM FOR MULTIPLE-DIMENSION TPC CODES

CROSS-REFERENCE TO RELATED APPLICATIONS

The present application claims priority to Provisional Application No. 62/312,324 entitled "Hybrid Soft Decoding Algorithm For Multiple Dimensions TPC Codes," filed Mar. 23, 2016, which is assigned to the assignee hereof and expressly incorporated by reference herein in its entirety.

TECHNICAL FIELD

The present disclosure relates generally to error correcting codes, and in particular, to efficient decoding of Turbo Product Codes.

BACKGROUND

Error Control Coding (ECC) schemes are essential in data storage applications to provide data integrity. Reliability of storage systems such as NAND flash memories may decline as higher storage density is achieved with multi-level cell (MLC)/triple-level cell (TLC) technologies. Different ECC schemes can be used to detect and correct the errors and improve the reliability of these systems. The ECC codes may include low-density parity-check (LDPC) codes, Bose-Chaudhuri-Hocquenghem (BCH) codes, turbo product codes (TPCs) and the like. TPC codes can outperform BCH and LDPC codes in term of hard decision decoding performance. However, in some situations, soft decoding performance of LDPC codes is better than the soft decoding performance of TPC codes. Hardware complexity of TPC codes is generally much lower than hardware complexity of LDPC codes, which make them a suitable choice for storage applications. There is a need in the art to improve soft decoding performance of the TPC codes.

SUMMARY

Systems, methods, and computer-readable storage media that implement techniques for decoding a multi-dimensional TPC codeword are disclosed. In an example, the techniques involve receiving a first set of soft information corresponding to a TPC codeword. The TPC codeword comprises at least one codeword corresponding to a first dimension, at least one codeword corresponding to a second dimension and at least one codeword corresponding to a third dimension. The techniques also involved iteratively performing a first soft decoding procedure on the at least one codeword corresponding to the first dimension of the TPC codeword to generate a first candidate codeword. Upon determining that the first candidate codeword is not a correct codeword, the techniques further involve performing a second decoding procedure on the at least one codeword corresponding to the third dimension of the TPC codeword to generate a second candidate codeword. The second decoding procedure generates a second set of soft information to be used at a later iteration of the first decoding procedure.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
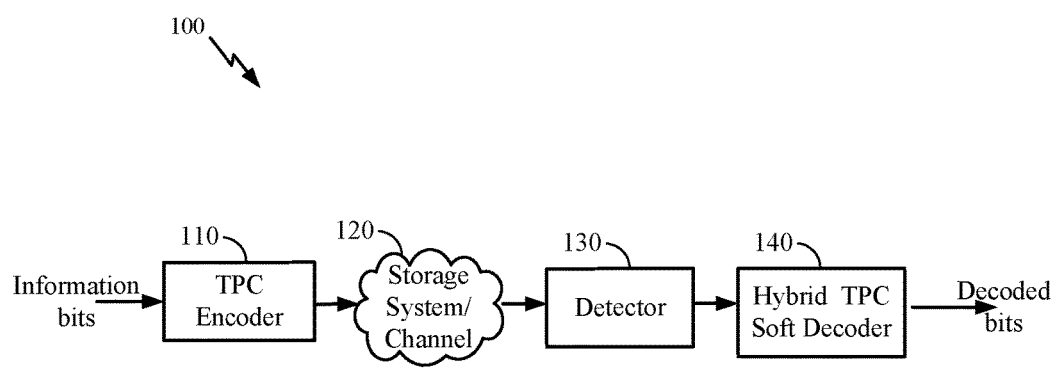
FIG. 1 illustrates an example high level block diagram of a turbo product code (TPC) error correcting system, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The term "error correcting code (ECC)" is used herein to refer to a codeword that is generated by a process of adding redundant data, or parity data, to a message such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes may include turbo product codes (TPC), low density parity check codes (LDPC), Bose-Chaudhuri-Hocquenghem (BCH) codes, Reed Solomon codes, and the like.

The term "hard decision" is used herein to refer to a bit that comprises a "0" or a "1" value, and is associated with a particular location within a codeword. A "hard decision"

may also be referred to as a "hard output" or "hard information." In some embodiments, the reliability of each hard decision may be known. The "reliability" of a hard decision refers to a probability (e.g., a value from "0" through "1") that the corresponding hard decision is correct. A "reliability" may also be referred to as "soft information" or a "soft output." In a NAND channel, a reliability for each bit may be obtained, for example, by multiple read operations from the NAND memory using different thresholds. In general, if the hard decision decoding of a codeword fails, soft information can be used to decode the failed codeword using soft decoding techniques, such as Chase decoding.

Turbo product codes are a promising candidate for correcting errors in storage applications. Turbo product codes may include two or more dimensions, each of which corresponding to a class of error correcting codes, such as BCH codes, Reed Solomon codes, or the like. The ECC code corresponding to each dimension of the TPC code is referred to herein as a constituent code. In one example, a two-dimensional TPC codeword may include one or more error correcting codewords (e.g., BCH codewords) corresponding to its first dimension, and one or more error correcting codewords corresponding to its second dimension.

TPC codes may be decoded by performing an iterative decoding procedure on the constituent codewords in each of the dimensions. As an example, for decoding a TPC code with BCH constituent codes, the TPC decoder performs BCH decoding on one or more codewords in the first dimension and one or more codewords in the second dimension of the TPC code. The TPC decoder may iteratively continue the decoding process until either a correct codeword is found or decoding failure is declared.

Message passing-based decoding algorithms generally have superior performance compared to hard-decision decoding algorithms and/or other soft decision decoding algorithms. However, hardware complexity of the message passing decoding algorithms is much higher than hardware complexity of hard-decision decoding algorithms and/or other soft decoding algorithms. Chase decoding is a soft decision decoding algorithm that can be implemented with reasonable hardware complexity but with some performance degradation compared to the performance of message passing decoding algorithms. Therefore, Chase decoding algorithm is commonly used as a soft decoding algorithm for BCH and/or RS codes.

Certain embodiments disclose a hybrid soft decoding scheme for TPC codes which improves decoding performance of TPC coding with limited hardware overhead. In one embodiment, the proposed hybrid decoding algorithm utilizes a sub-optimal maximum a posteriori (MAP) decoding for decoding constituent codes corresponding to one or more of the dimensions of the TPC codeword and, uses Chase algorithm for decoding constituent codewords in other dimensions. The hybrid soft decoding scheme updates the soft information in the iterative decoding procedure, which improves soft decoding performance of the TPC codes.

FIG. 1 illustrates an example high level block diagram of a TPC error correcting system 100, in accordance with certain embodiments of the present disclosure. In the example shown, TPC encoder 110 receives information bits that include data which is desired to be stored in a storage system 120 or transmitted over a communications channel. TPC encoded data is output by TPC encoder 110 and is written to storage 120. In various embodiments, storage 120 may include a variety of storage types or media, such as magnetic disk drive storage, Flash storage, etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested (e.g., by an application or a user), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to the hybrid soft TPC decoder 140 which performs TPC decoding using the decision and/or reliability information. The soft input decoder utilizes both the decision and the reliability information to decode the codeword. Details of the hybrid soft TPC decoder is described corresponding to FIGS. 4 through 6. After decoding, the decoded bits generated by TPC decoder are passed to the appropriate entity (e.g., the user or application which requested it). With proper encoding and decoding, the information bits match the decoded bits.

TPC codes may have two or more dimensions. In one embodiment, a three-dimensional TPC code is considered with BCH constituent codes. It should be noted that the BCH codes corresponding to different dimensions may have similar or different code parameters, such as block length, code rate, and the like. Notice that, the methods disclosed herein are not limited to TPC decoder with BCH constituent codes and can be applied to TPC decoder with any class of constituent codes.

Figure 2:
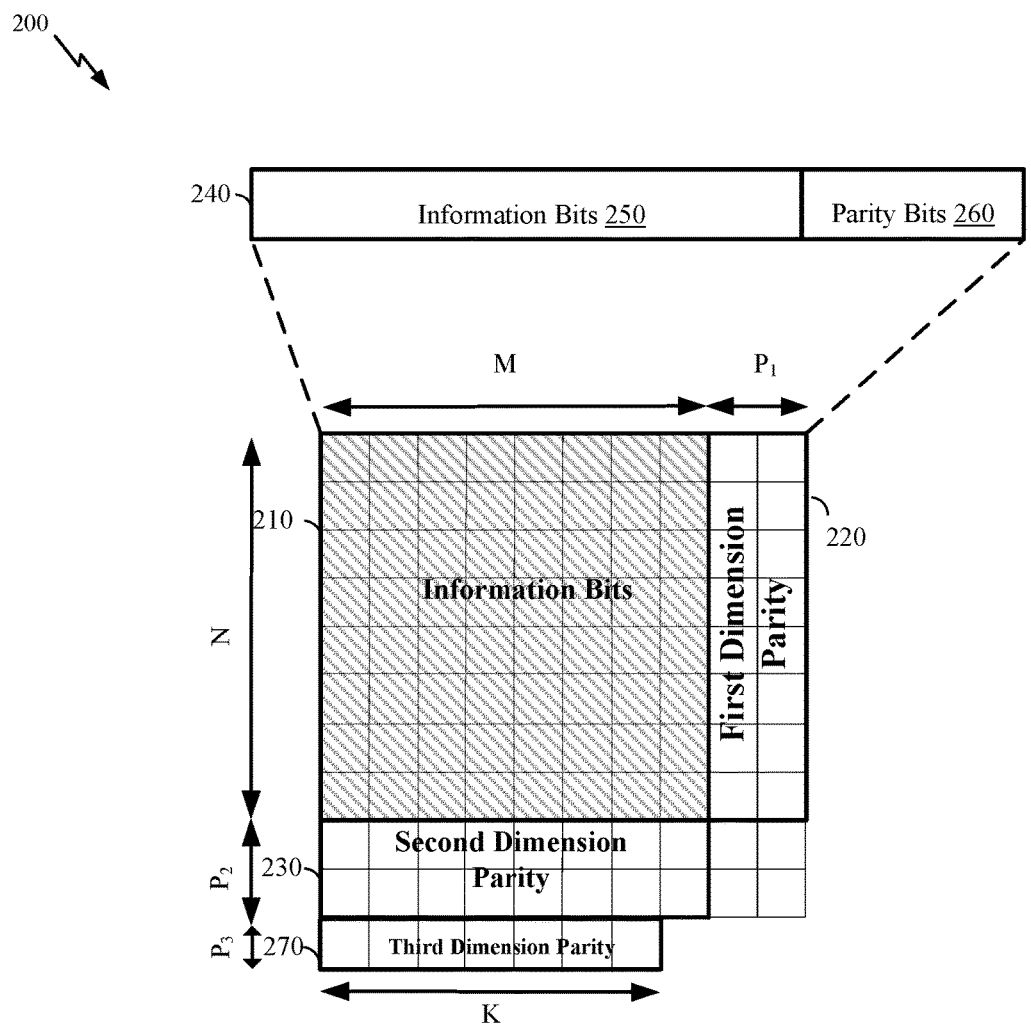
FIG. 2 illustrates an example block diagram of a TPC codeword, in accordance with certain embodiments of the present disclosure.

FIG. 2 illustrates an example three-dimensional TPC codeword, in accordance with certain embodiments of the present disclosure. As illustrated, the TPC codeword 200 may be a matrix of size $(N+P_2+P_3) \times (M+P_1)$, in which N represents number of rows of information bits, M represents number of columns of information bits, $P_1$ represents number of first dimension parity bits (e.g., row parity bits), $P_2$ represents number of second dimension parity bits (e.g., column parity bits), and $P_3$ represents number of third dimension parity bits. Information bits can be represented by a matrix of size $N \times M$ (e.g., matrix 210), first dimension parity bits can be represented by a matrix of size $N \times P_1$ (e.g., matrix 220), second dimension parity bits may be represented by a matrix of size $P_2 \times M$ (e.g., matrix 230), and third dimension parity bits may be represented by a matrix of size $P_3 \times K$ (e.g., matrix 270). The TPC codeword may include N codewords corresponding to its first dimension (e.g., row codewords), M codewords corresponding to its second dimension (e.g., column codewords) and K codewords corresponding to its third dimension. Each row codeword 240 includes multiple information bits 250 and one or more parity bits 260. Similarly, each column codeword includes multiple information bits and one or more parity bits. As an example, if BCH codes are used as row constituent codes, the row codewords 1 through N are constructed using BCH encoding. Similarly, column codewords 1 through M, and third dimension codewords 1 through K are generated based on one or more error correcting codes (e.g., BCH code, Reed Solomon code, etc.).

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets. The TPC decoder may then encode the information corresponding to the third dimension to generate K parity bits.

Figure 3:
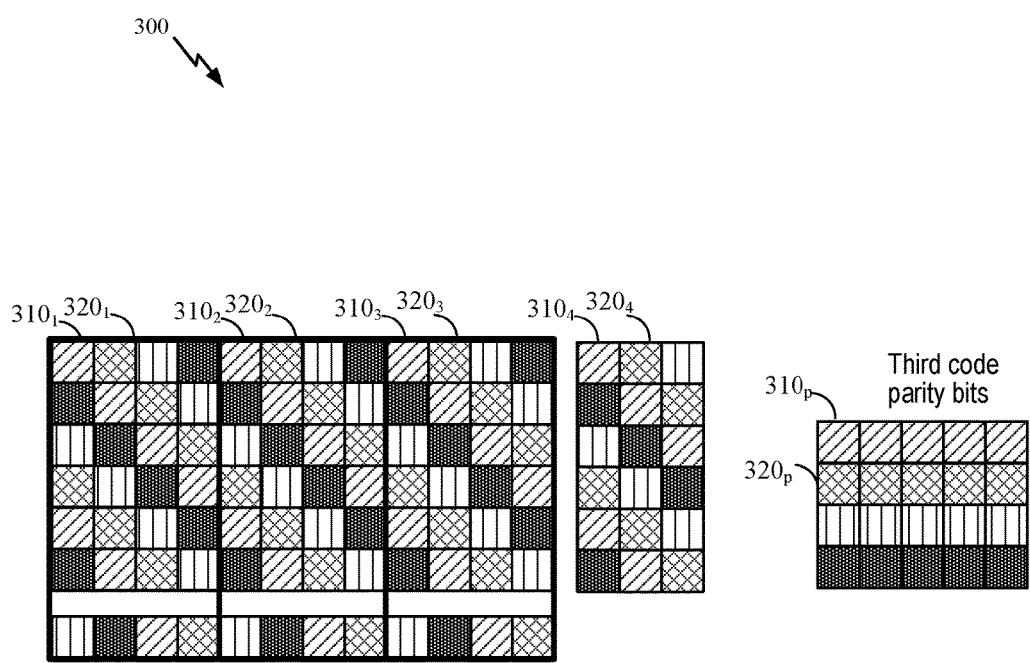
FIG. 3 illustrates an example interleaving method for the third dimension codeword in a TPC code, in accordance with certain embodiments of the present disclosure.

In one embodiment, before generating the codewords in the third dimension, the received bits may be interleaved using an interleaving scheme. An example interleaving method is shown in FIG. 3. However, any interleaving scheme known in the art may be used for generating the third dimension codes without departing from the teachings of the present disclosure. FIG. 3 illustrates an example interleaving method for the third dimension codeword in a TPC code 300, in accordance with certain embodiments of the present disclosure. As illustrated, the information bits may be divided into several sets and each set is used to generate one or more parity bits. For example, the blocks corresponding to a first set are used to generate first parity bits, the blocks corresponding to a second set are used to generate second parity bits, and the like. In the example illustrated in FIG. 3, blocks $310_1$, $310_2$, $310_3$ and $310_4$ may be used to generate parity bits $310_p$. Similarly, blocks $320_1$, $320_2$, $320_3$ and $320_4$ may be used to generate parity bits $320_p$.

Error correction capability of the third dimension constituent code in a TPC codes is usually designed to be smaller than the error correction capability of the constituent codes corresponding to the first and the second dimensions. For example, the first dimension may have $t_1=5$, second dimension may have $t_2=5$ and third dimension may have $t_3=2$ or $t_3=3$. One reason could be the fact that many of the errors in the TPC codeword are corrected by the first and the second dimension codes before the third dimension codes are decoded. It should be noted that Chase decoding algorithm has much higher miscorrection probability when correction probability of a BCH code is small. Therefore, if Chase decoding is used to decode the third constituent code codewords, the decoding performance will suffer. In addition, soft decoding of a TPC code relies on iteratively decoding constituent codewords for different dimensions. If at some point, the codeword is miscorrected in any of the dimensions, the total performance of the TPC decoder will be negatively impacted.

It should be noted that Chase algorithm is a soft-input hard-output decoding algorithm, therefore, the decoder is unable to provide soft information for next iteration decoding and/or update the soft information corresponding to each bit. Thus, in conventional Chase decoding procedure, the soft information that is used as input for any of the decoding iterations depends only on the originally received reliability values (e.g., LLR values). This results in a performance gap in soft-decoding performance of TPC codes (e.g., using Chase decoding procedure) compared to decoding performance of LDPC codes.

In one embodiment, a novel hybrid soft decoding scheme for TPC codes is disclosed that updates the soft information during the decoding process. This results in improved performance compared to other conventional decoding techniques for TPC codes. In one embodiment, the hybrid soft decoding scheme uses the third dimension constituent code to update the soft information for the next decoding-iteration. In one embodiment, a soft-input soft-output (SISO) decoding algorithm is used to decode the third dimension constituent codes. In addition, one or more constituent codes in the TPC code are decoded using soft input hard output decoding procedures (that have smaller hardware complexity). One embodiment utilizes a combination of one or more Chase decoders and one or more SISO decoders to iteratively decode the codewords, update the soft information, and correct the errors. It should be noted that although Chase decoders and SISO decoders are used in some embodiments, the hybrid decoding scheme can, in general, use any type of soft and/or hard decoders without departing from the teachings of the present disclosure.

A maximum a posteriori probability (MAP) decoder is a good candidate for the SISO decoder in terms of error correction performance. However, hardware cost for a BCH MAP decoder is very high. In one embodiment, a tradeoff between error performance and hardware complexity is considered (e.g., a sub-optimal MAP decoder with lower hardware complexity). As an example, the MAP decoder for a first order Reed-Muller code is much simpler than the original MAP decoder. In addition, the MAP decoding for the first order Reed-Muller code has a regular hardware architecture. Also, one of the properties of the first order Reed-Muller codes is that they are dual codes of extended Hamming codes. Furthermore, extended BCH codewords can be transformed to extended Hamming codewords by certain permutations. In one embodiment, the above properties are used to apply the MAP decoding algorithm for the first order Reed-Muller codes to the extended BCH codes with certain permutation and transformations. In this way, a sub-optimal MAP decoder can be used for the extended BCH codes in the third dimension of a TPC code. In one embodiment, based on the sub-optimal MAP decoding procedure for first order Reed-Muller codes, an extended BCH codeword is transformed to an extended Hamming codeword, and MAP decoding is applied to the extended Hamming codeword.

It should be noted that the proposed hybrid soft decoder improves the decoding performance of the decoder when correction capability of the third constituent code is small. Since error correction capability of the third constituent code in a TPC code is designed to be small, the hybrid soft decoder disclosed herein will be a suitable choice for decoding the TPC codes. In one embodiment, the TPC codes may be constructed as shown in FIG. 2, in which the third dimension constituent code is an extended BCH code with a small error correction capability. An interleaving scheme as shown in FIG. 3 can also be applied to the code to enhance the performance.

Figure 4:
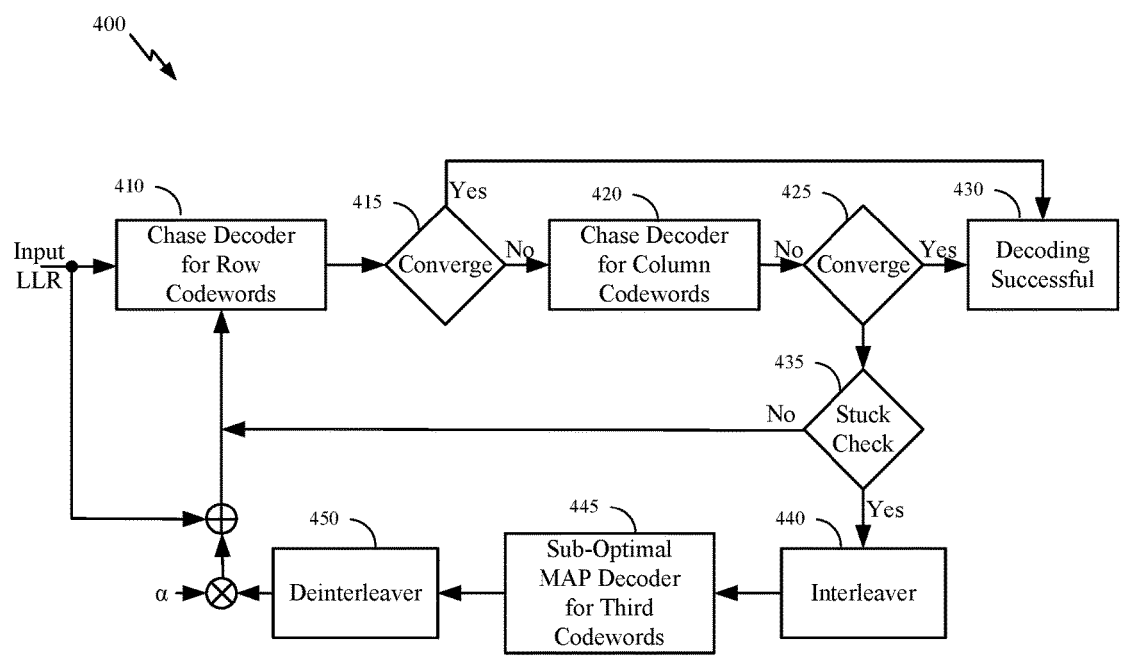
FIG. 4 illustrates an example hybrid soft decoding scheme, in accordance with certain embodiments of the present disclosure.

FIG. 4 illustrates a high level block diagram 400 of an example hybrid soft TPC decoder, in accordance with certain embodiments of the present disclosure. The TPC decoder may iteratively perform decoding on one or more of the constituent codes to generate a correct TPC codeword. The receiver receives a TPC codeword and soft information (e.g., Log likelihood ratios (LLR)) are generated for each bit in the received codeword. At 410, a soft decoder such as Chase decoder decodes one or more codewords corresponding to first dimension constituent code (e.g., row codewords) in the received codeword. As an example, the decoder may decode one or more of the N row codewords in the TPC codeword (as illustrated in FIG. 2). In one example, the decoder may perform Chase decoding on each of the row codewords based on the received LLR values. The LLR values are utilized to select the least reliable bits. The decoder may flip one or more of the least reliable bits to generate one or more decoded row codewords.

At 415, the decoder checks whether or not it has converged to a correct codeword. If there are still some errors within the TPC codeword, at 420, Chase decoder is applied to one or more codewords in the second dimension (e.g., column codewords). At 425, the decoder checks if decoding has been successful or not. If the decoding procedure has been successful, the decoder stops and outputs the decoded bits. If the TPC decoding has not been successful (e.g., the decoder did not converge to a correct codeword), the TPC decoder may iteratively perform decoding on the first dimension and/or second dimension codewords to correct the errors. At 435, the device checks if the decoding procedure is stuck or not. The decoding procedure is considered to be stuck if the decoder is unable to correct the errors that are remaining in the codeword. For example, the decoding procedure is considered to be stuck if constituent codewords fail to be decoded in any iteration (e.g., all constituent codewords are not decoded or no additional constituent codeword is decoded in a next iteration), or if the number of iterations performed reaches a maximum number. Upon determining that the decoders corresponding to the first and the second dimensions are unable to correct the remaining errors, at 440, an interleaver interleaves the bits to generate one or more codewords corresponding to the third dimension. Without loss of generality, one example of the interleaver is shown in FIG. 3.

At 445, a sub-optimal MAP decoding procedure is applied to the one or more third dimension codewords. The outputs of sub-optimal MAP decoder are extrinsic values corresponding to each bit. At 450, the extrinsic values pass through a de-interleaver before being multiplied with a scaling factor and added to the originally received soft information to generate updated LLR values. In one example, the de-interleaver may performs operations to reorder the interleaved data bits according to their original bit locations. The scaling factor may be determined based on the parameters of the system through simulations.

In this example hybrid soft decoder, since the soft information is updated by the sub-optimal MAP decoding of the third codewords, Chase decoding of the first and the second dimensions will no longer be stuck. The Chase decoders operate on the updated set of soft information to find different least reliable bits and correct the remaining errors. The decoding process iteratively continues until a correct codeword is found. If the decoder reaches a maximum number of iterations, the decoding process may stop even if a correct codeword is not found.

In one embodiment, the interleaving scheme and/or the scaling factor α can be modified and/or adjusted from one iteration to another iteration to improve the decoding performance. It should be noted that although the hybrid decoder scheme shown in FIG. 4 operates on a three dimensional TPC code, in general, the hybrid decoder may be used to decode a TPC code with any number of dimensions without departing from the teachings of the present disclosure. In addition, each of the Chase decoders corresponding to each dimension may include any number of decoder units for decoding one or more codewords in parallel. For example, depending on throughput and size requirements of the TPC decoder, the Chase decoder may utilize a single decoder unit to decode the N row codewords sequentially. Alternatively, the Chase decoder may include N decoding units that run in parallel to decode the N row codewords in parallel. In another embodiment, the TPC decoder may include Q Chase decoders, 1<Q<N that run in parallel. The TPC decoder may utilize the Q decoders one or more times to decode some or all the row codewords. As an example, N=30 and Q=2.

Figure 5:
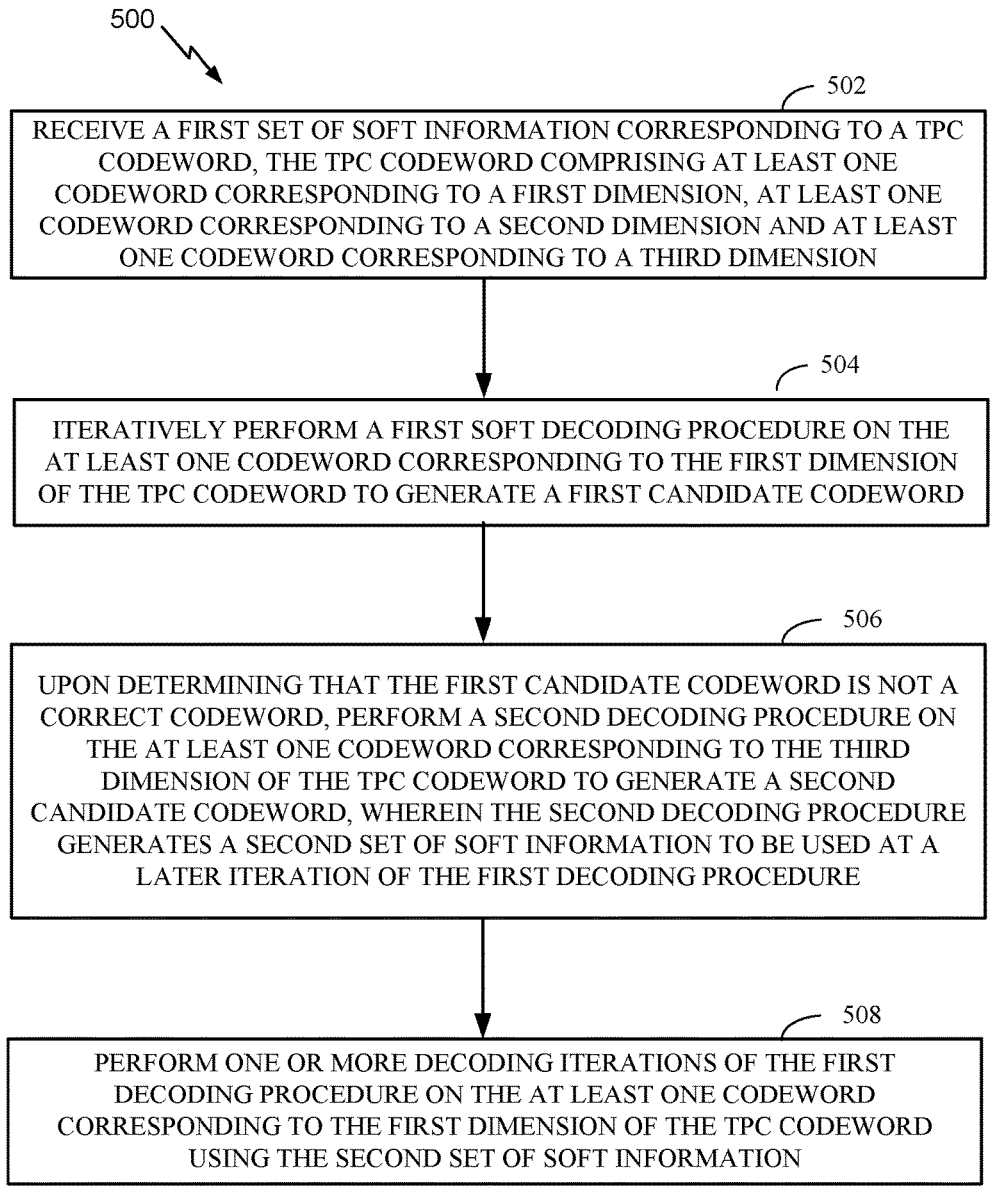
FIG. 5 illustrates example operations that may be performed by a device for hybrid soft decoding of a message, in accordance with certain embodiments of the present disclosure.

FIG. 5 illustrates example operations 500 that may be performed by a device for hybrid soft decoding of a TPC codeword, in accordance with certain embodiments of the present disclosure. At 502, the device receives a first set of soft information corresponding to the TPC codeword. The TPC codeword includes at least one codeword corresponding to a first dimension, at least one codeword corresponding to a second dimension and at least one codeword corresponding to a third dimension. In one embodiment, the at least one codeword corresponding to the third dimension of the TPC codeword includes an extended BCH code.

At 504, the device iteratively performs a first soft decoding procedure on the at least one codeword corresponding to the first dimension of the TPC codeword to generate a first candidate codeword. At 506, upon determining that the first candidate codeword is not a correct codeword, the device performs a second decoding procedure on the at least one codeword corresponding to the third dimension of the TPC codeword to generate a second candidate codeword. The second decoding procedure generates a second set of soft information to be used at a later iteration of the first decoding procedure. In one embodiment, the device generates the second set of soft information by scaling soft outputs corresponding to the second decoding procedure and adding them to the original soft information.

At 508, the device performs one or more decoding iterations of the first decoding procedure on the at least one codeword corresponding to the first dimension of the TPC codeword using the second set of soft information.

In one embodiment, the first candidate codeword is generated by iteratively performing the first soft decoding procedure on the at least one codeword corresponding to the first dimension of the TPC codeword followed by performing a third decoding procedure on the at least one codeword corresponding to the second dimension of the TPC codeword. In one embodiment, the first and the third soft decoding procedures are Chase decoding procedure. In one embodiment, the second decoding procedure is MAP decoding procedure (e.g., sub-optimal MAP decoding for first order Reed Muller codes).

In one embodiment, the device performs an interleaving procedure on the first set of soft information to generate an interleaved set of soft information, and performs the second decoding procedure on the at least one codeword corresponding to the third dimension using the interleaved set of soft information.

Figure 6:
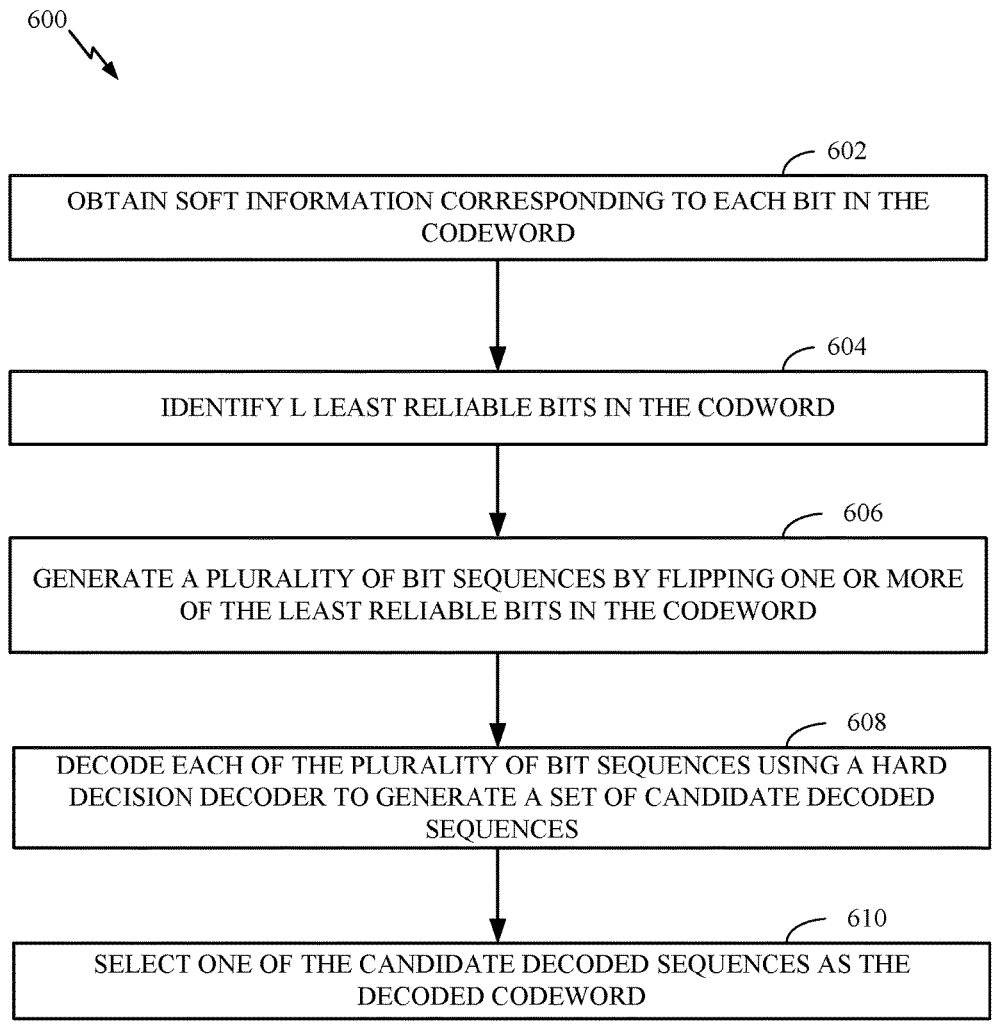
FIG. 6 illustrates a flow diagram describing an example process of decoding a codeword using Chase decoding algorithm, in accordance with certain embodiments of the present disclosure.
Figure 7:
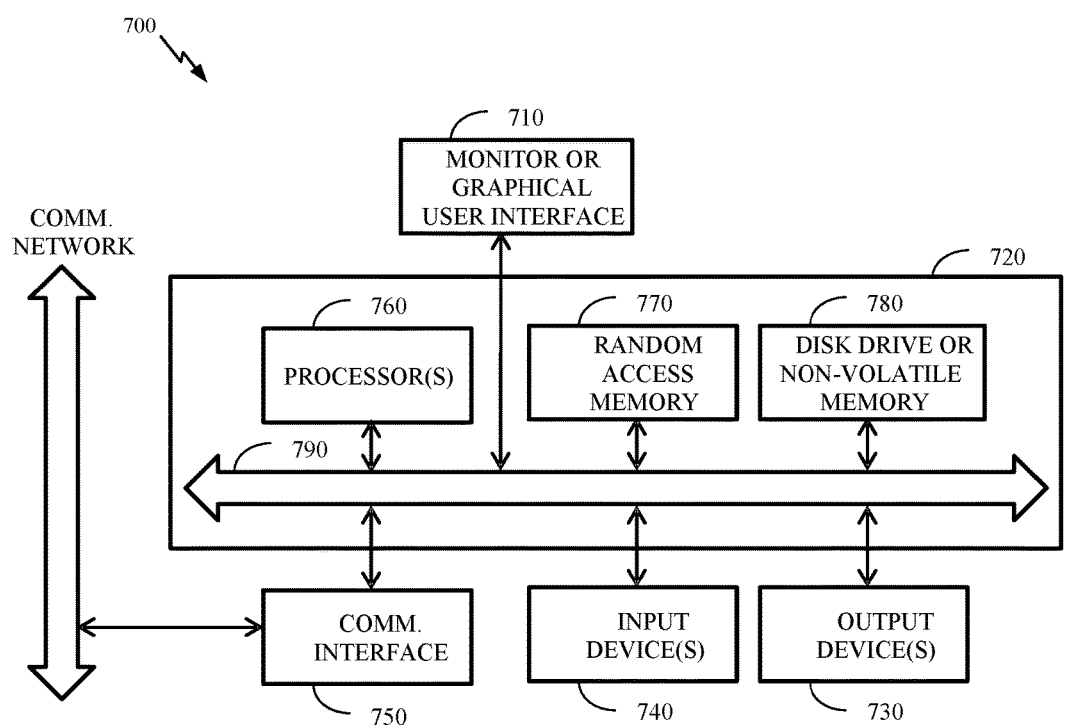
FIG. 7 describes one potential implementation of a device which may be used to perform hybrid soft decoding on a codeword, according to one embodiment.

FIG. 6 illustrates a flow diagram describing an example process of decoding a codeword using Chase decoding algorithm, in accordance with certain embodiments of the present disclosure. In this example, process 600 is implemented by a Chase (L) decoder. At 602, a first codeword corresponding to a plurality of information bits and a plurality of parity bits is received. Soft information (e.g., reliabilities) corresponding to each of the bits in the codeword are obtained. At 604, the set of reliabilities are used to identify the L locations of least reliable bits (LRBs) among the received bits. The parameter L can, in general, be selected to be any integer. At 606, all possible bit flip patterns of the L least reliable bits of the input set of hard decisions (e.g., the first codeword) are generated to form $2^L$ flipped bit sequences. For example, each bit sequence is generated by flipping one or more bits in the first codeword.

At 608, each of the flipped bit sequences are decoded using a hard decision decoding algorithm (e.g., BCH hard decoder) to generate a set of candidate decoded bit sequences. The flipped set of bit sequences can be represented as $K=\{k^{(j)}, j=0, 1, \ldots, 2^L-1\}$. Each of the set of $2^L$ bit sequences is fed into a hard decision error correction decoder. The hard decision error correction decoder then attempts to decode each of the $2^L$ bit sequences. For each decoding try, there are two possibilities: if the hard decision decoder deems the input bit sequence uncorrectable, that particular decoding attempt is discarded. If the hard decision decoder deems the input bit sequence correctable, the decoder will propose one or more bit flips to the input bit sequence.

Assuming that the hard decision error correction decoder is a BCH decoder with t=3, then the decoder can propose up to t locations of the correctable input bit sequence that need to be flipped. Note that the locations of the bit flips indicated by the hard decision decoder can be anywhere in the codeword, not just in the L least reliable locations. Set $X=\{\hat{x}^{(j)}\}, j=0, 1, \ldots, l$, where $1 \le 2^L\}$ represents the set of decoded bit sequences output by the hard decision decoder (e.g., which is in turn a part of the soft decision Chase decoder). Because not every bit sequence may be decodable, the number of decoded bit sequences l may be fewer than the total number of bit sequences, $2^L$. Furthermore, at least some of the decoded bit sequences of set X are not distinct since multiple bit sequences may be decoded to the same codeword. The decoded bit sequences of set X may be thought of as a list of "candidate codewords" or "candidate decoded bit sequences" from which one is to be selected and output by the Chase decoder.

At 610, a decoded bit sequence is selected from the set of candidate decoded bit sequences. The selected decoded bit sequence includes one or more proposed corrections corresponding to one or more of the received bits. If the decoded set X is empty, the codeword is uncorrectable. If X is not empty, one of the candidate codewords is selected from the set of candidate codewords to be output from the Chase decoder as the decoded codeword. A metric, such as Euclidean distance of the decoded component codeword from the received word is usually generated to compare different candidate decoded codewords and select one that is the most likely decoded codeword by comparing the candidate codewords to the received codeword. In general, any method may be used to select the decoded bit sequence without departing from the teachings of the present disclosure.

Various sub-optimal MAP decoding procedures may be available. An example of such procedures is described in "Simple MAP decoding of first-order Reed-Muller and Hamming codes," to A. Ashikhmin, S. Litsyn, published in *IEEE Trans. Inform Theory*, vol. 50, no. 8, pp. 1812-1818, August 2004. Another example of such procedures is described in "A low-complexity soft-decision decoder for extended BCH and RS-like codes," to F. Therattil and A. Thangaraj, published in Proceedings. International Symposium on Information Theory, 2005. ISIT 2005, September 2005. These two procedures and content of the related publications are incorporated herein by reference in their entirety.

It should be noted that although the example hybrid soft decoder described herein uses Chase decoder for decoding two of the constituent codes corresponding to two of the dimensions of the TPC code, and a message-passing based decoding procedure for decoding the third dimension, in general, any combination of message passing algorithm and/or other soft decoding algorithms could be used to decode different constituent codes of a TPC codeword without departing from the teachings of the present disclosure. In addition, BCH codes are used as an example of the constituent codes in each dimension of the TPC code. Any other error correcting code may also be used in a TPC code without departing from the teachings of the present disclosure.

FIG. 9 describes one potential implementation of a device which may be used to perform hybrid soft decoding on a codeword, according to one embodiment. FIG. 9 is merely illustrative of an embodiment incorporating the present invention and does not limit the scope of the invention as recited in the claims. One of ordinary skill in the art would recognize other variations, modifications, and alternatives. In one embodiment, computer system 900 typically includes a monitor 910, a computer 920, user output devices 930, user input devices 940, communications interface 950, and the like.

As shown in FIG. 9, computer 920 may include a processor(s) 960 that communicates with a number of peripheral devices via a bus subsystem 990. These peripheral devices may include user output devices 930, user input devices 940, communications interface 950, and a storage subsystem, such as random access memory (RAM) 970 and disk drive 980.

User input devices 930 include all possible types of devices and mechanisms for inputting information to computer system 920. These may include a keyboard, a keypad, a touch screen incorporated into the display, audio input devices such as voice recognition systems, microphones, and other types of input devices. In various embodiments, user input devices 930 are typically embodied as a computer mouse, a trackball, a track pad, a joystick, wireless remote, drawing tablet, voice command system, eye tracking system, and the like. User input devices 930 typically allow a user to select objects, icons, text and the like that appear on the monitor 910 via a command such as a click of a button or the like.

User output devices 940 include all possible types of devices and mechanisms for outputting information from computer 920. These may include a display (e.g., monitor 910), non-visual displays such as audio output devices, etc.

Communications interface 950 provides an interface to other communication networks and devices. Communications interface 950 may serve as an interface for receiving data from and transmitting data to other systems. Embodiments of communications interface 950 typically include an Ethernet card, a modem (telephone, satellite, cable, ISDN), (asynchronous) digital subscriber line (DSL) unit, FireWire interface, USB interface, and the like. For example, communications interface 950 may be coupled to a computer network, to a FireWire bus, or the like. In other embodiments, communications interfaces 950 may be physically integrated on the motherboard of computer 920, and may be a software program, such as soft DSL, or the like.

In various embodiments, computer system 900 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 920 includes one or more Xeon microprocessors from Intel as processor(s) 960. Further, one embodiment, computer 920 includes a UNIX-based operating system.

RAM 970 and disk drive 980 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 970 and disk drive 980 may be configured to store the basic programming and data constructs that provide the functionality of the present invention.

Software code modules and instructions that provide the functionality of the present invention may be stored in RAM 970 and disk drive 980. These software modules may be executed by processor(s) 960. RAM 970 and disk drive 980 may also provide a repository for storing data used in accordance with the present invention.

RAM 970 and disk drive 980 may include a number of memories including a main random access memory (RAM) for storage of instructions and data during program execution and a read only memory (ROM) in which fixed non-transitory instructions are stored. RAM 970 and disk drive 980 may include a file storage subsystem providing persistent (non-volatile) storage for program and data files. RAM 970 and disk drive 980 may also include removable storage systems, such as removable flash memory.

Bus subsystem 990 provides a mechanism for letting the various components and subsystems of computer 920 communicate with each other as intended. Although bus subsystem 990 is shown schematically as a single bus, alternative embodiments of the bus subsystem may utilize multiple busses.

FIG. 9 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus for hybrid soft decoding of a turbo product code (TPC) codeword, comprising:
 a memory;
 at least one processor coupled to the memory, the at least one processor is configured to:
  receive a first set of soft information corresponding to a TPC codeword, the TPC codeword comprising at least one codeword corresponding to a first dimension, at least one codeword corresponding to a second dimension and at least one codeword corresponding to a third dimension, wherein an error correction capability of the third dimension is smaller than error correction capabilities of the first dimension and the second dimension;
  iteratively perform, based on first soft information, a first soft-input hard-output (SIHO) decoding procedure on the at least one codeword corresponding to the first dimension of the TPC codeword to generate a first candidate codeword; and
  upon determining that the first candidate codeword is not a correct codeword:
   perform a second soft-input soft-output (SISO) decoding procedure on the at least one codeword corresponding to the third dimension of the TPC codeword to generate a second candidate codeword, wherein the second SISO decoding procedure generates a second set of soft information, and
   update the first soft information of the first SIHO decoding procedure based on the second soft information of the second SISO decoding procedure.

2. The apparatus of claim 1, wherein the first candidate codeword is generated by iteratively performing the first soft-input hard-output (SIHO) decoding procedure on the at least one codeword corresponding to the first dimension of the TPC codeword followed by performing a third decoding procedure on the at least one codeword corresponding to the second dimension of the TPC codeword.

3. The apparatus of claim 1, wherein the processor is further configured to:
perform one or more decoding iterations of the first soft-input hard-output (SIHO) decoding procedure on the at least one codeword corresponding to the first dimension of the TPC codeword using the second set of soft information.

4. The apparatus of claim 1, wherein the at least one codeword corresponding to the third dimension of the TPC codeword comprise an extended Bose-Chaudhuri-Hocquenghem (BCH) code.

5. The apparatus of claim 1, wherein the first soft-input hard-output (SIHO) decoding procedure is Chase decoding.

6. The apparatus of claim 1, wherein the second soft-input soft-output (SISO) decoding procedure is Maximum a posteriori (MAP) decoding procedure.

7. The apparatus of claim 6, wherein the second soft-input soft-output (SISO) decoding procedure is the sub-optimal MAP decoding for first order Reed Muller codes.

8. The apparatus of claim 1, wherein the at least one processor is further configured to:
perform an interleaving procedure on the first set of soft information to generate an interleaved set of soft information; and
perform the second soft-input soft-output (SISO) decoding procedure using the interleaved set of soft information.

9. The apparatus of claim 1, wherein the at least one processor is further configured to:
generate the second set of soft information by scaling soft outputs corresponding to the second soft-input soft-output (SISO) decoding procedure.

10. A method for hybrid soft decoding of a turbo product code (TPC) codeword, comprising:
receiving, by a system, a first set of soft information corresponding to a TPC codeword, the TPC codeword comprising at least one codeword corresponding to a first dimension, at least one codeword corresponding to a second dimension and at least one codeword corresponding to a third dimension, wherein an error correction capability of the third dimension is smaller than error correction capabilities of the first dimension and the second dimension;
iteratively performing, by the system based on first soft information, a first soft-input hard-output (SIHO) decoding procedure on the at least one codeword corresponding to the first dimension of the TPC codeword to generate a first candidate codeword; and
upon determining that the first candidate codeword is not a correct codeword:
performing, by the system, a second soft-input soft-output (SISO) decoding procedure on the at least one codeword corresponding to the third dimension of the TPC codeword to generate a second candidate codeword, wherein the second SISO decoding procedure generates a second set of soft information, and
updating the first soft information of the first SIHO decoding procedure based on the second soft information of the second SISO decoding procedure.

11. The method of claim 10, wherein the first candidate codeword is generated by iteratively performing the first soft-input hard-output (SIHO) decoding procedure on the at least one codeword corresponding to the first dimension of the TPC codeword followed by performing a third decoding procedure on the at least one codeword corresponding to the second dimension of the TPC codeword.

12. The method of claim 10, further comprising:
performing one or more decoding iterations of the first soft-input hard-output (SIHO) decoding procedure on the at least one codeword corresponding to the first dimension of the TPC codeword using the second set of soft information.

13. The method of claim 10, wherein the at least one codeword corresponding to the third dimension of the TPC codeword comprise an extended Bose-Chaudhuri-Hocquenghem (BCH) code.

14. The method of claim 10, wherein the first soft-input hard-output (SIHO) decoding procedure is Chase decoding.

15. The method of claim 10, wherein the second soft-input soft-output (SISO) decoding procedure is Maximum a posteriori (MAP) decoding procedure.

16. The method of claim 10, wherein the second soft-input soft-output (SISO) decoding procedure is the sub-optimal MAP decoding for first order Reed Muller codes.

17. A non-transitory computer-readable storage medium comprising instructions that, upon execution by a processor of a computing device, configure the computing device to perform operations comprising:
receiving a first set of soft information corresponding to a turbo product code (TPC) codeword, the TPC codeword comprising at least one codeword corresponding to a first dimension, at least one codeword corresponding to a second dimension and at least one codeword corresponding to a third dimension, wherein an error correction capability of the third dimension is smaller than error correction capabilities of the first dimension and the second dimension;
iteratively performing, based on first soft information, a first soft-input hard-output (SIHO) decoding procedure on the at least one codeword corresponding to the first dimension of the TPC codeword to generate a first candidate codeword; and
upon determining that the first candidate codeword is not a correct codeword:
performing a second soft-input soft-output (SISO) decoding procedure on the at least one codeword corresponding to the third dimension of the TPC codeword to generate a second candidate codeword, wherein the second SISO decoding procedure generates a second set of soft information, and
updating the first soft information of the first SIHO decoding procedure based on the second soft information of the second SISO decoding procedure.

18. The non-transitory computer-readable storage medium of claim 17, wherein the first candidate codeword is generated by iteratively performing the first soft-input hard-output (SIHO) decoding procedure on the at least one codeword corresponding to the first dimension of the TPC codeword followed by performing a third decoding procedure on the at least one codeword corresponding to the second dimension of the TPC codeword.

19. The non-transitory computer-readable storage medium of claim 17, wherein the operations further comprise:

performing an interleaving procedure on the first set of soft information to generate an interleaved set of soft information; and performing the second soft-input soft-output (SISO) decoding procedure using the interleaved set of soft information.

20. The non-transitory computer-readable storage medium of claim 17, wherein the operations further comprise:

generating the second set of soft information by scaling soft outputs corresponding to the second soft-input soft-output (SISO) decoding procedure.

* * * * *